(12) United States Patent
Koyama

(10) Patent No.: US 9,412,780 B2
(45) Date of Patent: Aug. 9, 2016

(54) IMAGE SENSOR

(71) Applicant: SEIKO INSTRUMENTS INC., Chiba-shi, Chiba (JP)

(72) Inventor: Takeshi Koyama, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/666,497

(22) Filed: Mar. 24, 2015

(65) Prior Publication Data

US 2015/0279895 A1 Oct. 1, 2015

(30) Foreign Application Priority Data

Mar. 25, 2014 (JP) .................................. 2014-061696

(51) Int. Cl.
*H01L 31/062* (2012.01)
*H01L 31/113* (2006.01)
*H01L 27/146* (2006.01)

(52) U.S. Cl.
CPC ...... *H01L 27/14643* (2013.01); *H01L 27/1461* (2013.01); *H01L 27/1463* (2013.01); *H01L 27/14607* (2013.01)

(58) Field of Classification Search
CPC .................... H01L 27/14643; H01L 27/14663
USPC ........................... 257/292, 443, 462; 438/48
See application file for complete search history.

(56) References Cited

U.S. PATENT DOCUMENTS

2003/0170928 A1* 9/2003 Shimozono et al. ............ 438/73
2011/0242390 A1* 10/2011 Sogoh et al. ................... 348/311

OTHER PUBLICATIONS

Patent Abstracts of Japan, Publication No. 05-206495, Publication Date Aug. 13, 1993.

* cited by examiner

*Primary Examiner* — Theresa T Doan
(74) *Attorney, Agent, or Firm* — Adams & Wilks

(57) ABSTRACT

An image sensor has photodiodes formed in a Si substrate and configured to prevent carriers generated at a deep position of the Si substrate from affecting adjacent photodiodes due to lateral diffusion (crosstalk between pixels). A modified layer is formed between adjacent photodiodes and at a depth below that of the photodiodes by a laser to generate a recombination level to thereby suppress crosstalk between pixels.

9 Claims, 3 Drawing Sheets

IMAGE SENSOR

BACKGROUND OF THE INVENTION

1. Field of the Invention

The present invention relates to an image sensor including a semiconductor light receiving element.

2. Description of the Related Art

In general, an image sensor is formed of a light receiving portion pixel array including semiconductor light receiving elements. A photodetector of a photodiode type having a PN junction is widely used for the semiconductor light receiving element of each pixel included in the light receiving portion pixel array. Light entering each pixel is absorbed into a semiconductor substrate to generate carriers, and then the generated carriers are recombined at a depletion layer portion of the photodiode, with the result that an output of the semiconductor light receiving element is obtained as a voltage or a current.

Requirements for acquisition of high definition image data drove the size reduction of the pixel, making it difficult to obtain desired characteristics. In particular, degradation of characteristics due to crosstalk between pixels is conspicuous. Carriers generated immediately below a certain pixel diffuse in a lateral direction to be collected by a depletion layer portion of an adjacent pixel. The carriers are then recombined to become an unnecessary signal, resulting in an unstable output signal. In normal pixels, crosstalk components from adjacent regions are canceled with each other, and hence an output signal is less likely to be lowered. Particularly in a pixel that is arranged outermost, however, no cross component comes from an adjacent region, resulting in lowering of the output signal.

One countermeasure is to enhance the depth of the depletion layer of the photodetector so as to increase carrier collection efficiency. Another proposed method is to form a reflective insulating layer below a depletion layer so as to increase efficiency of collecting carriers into the depletion layer, to thereby suppress crosstalk (see, for example, Japanese Patent Application Laid-open No. Hei 5-206495).

The light with a long wavelength (red to infrared light), however, penetrates deeply into a Si substrate since the depth of the depletion layer can be increased to a limited extent (about 1.2=lm), disabling the suppression of the crosstalk between pixels due to lateral diffusion to an adjacent pixel. In the pixel configuration in which the reflective insulating film is formed below the depletion layer, incident light cannot be completely insulated, resulting in a problem of crosstalk due to carriers generated by transmitted light.

SUMMARY OF THE INVENTION

It is therefore an object of the invention of the subject application to provide an image sensor capable of suppressing crosstalk.

In order to achieve the object, an image sensor according to one embodiment of the present invention is configured as follows. Specifically, a semiconductor light receiving element includes: a semiconductor substrate of a first conductivity type; a semiconductor region of a second conductivity type, which forms a photodiode by being joined with the semiconductor substrate, in which a plurality of the photodiodes are arranged in an array, and the semiconductor substrate has a modified layer formed between adjacent ones of the plurality of photodiodes by laser light irradiation, the modified layer having a depth that is arbitrarily set depending on a wavelength of incident light.

According to the present invention, carriers generated at a deep position of the semiconductor substrate are trapped by the modified layer and are eliminated after recombination. Consequently, crosstalk between light receiving portion pixels due to lateral diffusion may be suppressed.

DETAILED DESCRIPTION OF THE INVENTION

Now, a plurality of embodiments of the present invention is described with reference to the accompanying drawings.

First Embodiment

Figure 1:
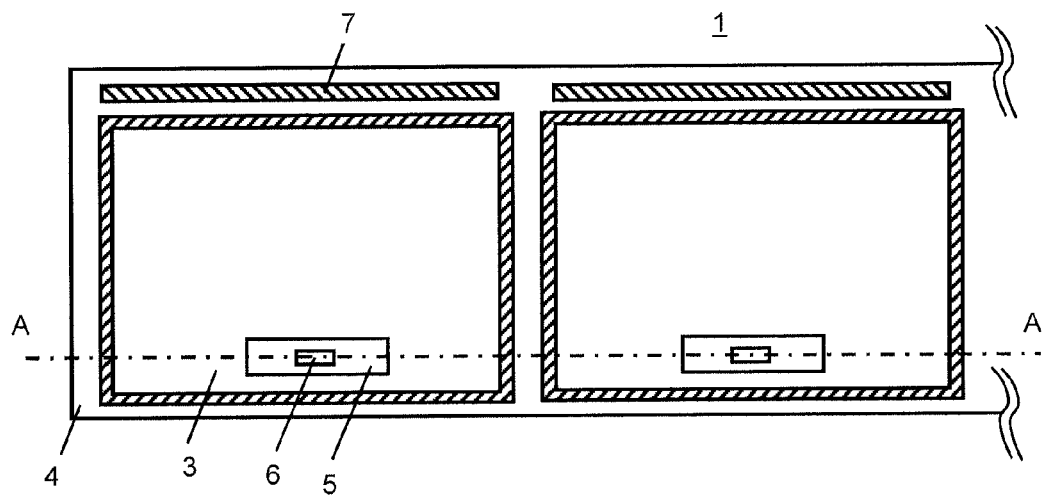
FIG. 1 is a plan view of a semiconductor light receiving element according to the present invention.
Figure 2:
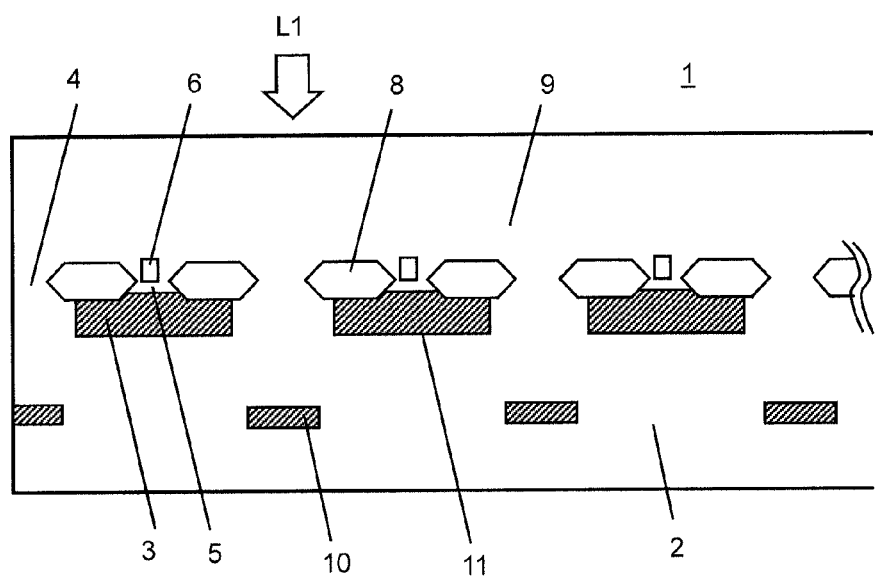
FIG. 2 is a cross-sectional view of a semiconductor light receiving element according to a first embodiment of the present invention taken along the line A-A of FIG. 1.

FIG. 1 is a plan view of a semiconductor light receiving element of an image sensor according to a first embodiment of the present invention. FIG. 2 is a cross-sectional view of the semiconductor light receiving element of the image sensor according to the first embodiment.

A semiconductor light receiving element 1 includes a P-type semiconductor substrate 2, an N-type layer region 3, a P-type semiconductor region 4, an N-type semiconductor region 5, a cathode electrode 6, an anode electrode 7, an element isolation region 8, and an insulating film 9, and is formed of a diode in this embodiment.

The semiconductor substrate 2 is formed of, for example, monocrystalline silicon as its material, and includes a modified layer 10 at a predetermined internal position. The insulating film 9 is formed of, for example, a silicon oxide film or a silicon nitride film, and functions as a film for protecting the semiconductor surface. The N-type layer region 3 forms a photodiode 11 through a PN junction with the semiconductor substrate 2. When a bias is applied to the cathode electrode 6, a depletion layer expands in the semiconductor substrate 2 so that the photodiode 11 functions as a light detection region for taking electric charges therein. The P-type semiconductor region 4 is formed so as to surround the N-type semiconductor region 3. The cathode electrode 6 and the anode electrode 7 are made of a metal material, and are formed into a rectangular shape by, for example, sputtering or the like to be electrically connected to the N-type layer region 3 and the P-type semiconductor region 4, respectively.

When light L1 enters the semiconductor light receiving element 1, the light L1 transmits through the insulating film 9 and the element isolation region 8. Each wavelength component of the irradiation light L1 reaches the inside of the semiconductor substrate 2 in accordance with its wavelength, and generates carriers. When the carriers diffuse to reach a depletion layer region in the PN junction, an output of the semiconductor light receiving element 1 is obtained as a voltage or a current.

Figure 3:
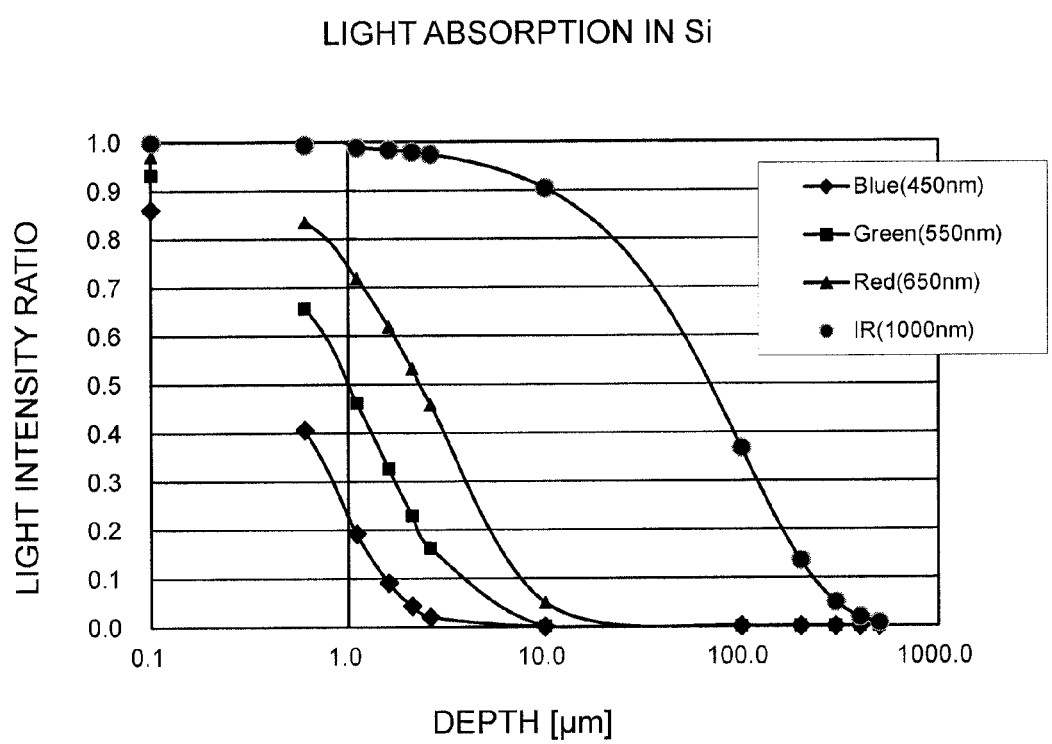
FIG. 3 is a graph showing light absorption in Si for each wavelength.

The irradiation light L1 is absorbed in Si in accordance with the Beer-Lambert law, $\log 10(I1/I0) = -\alpha L$, where I0 represents intensity of light before entering a medium, I1 represents intensity of light when moving through the medium, and $\alpha$ represents an absorption coefficient, so that light with a long wavelength reaches the semiconductor substrate 2 deeply. FIG. 3 is a graph showing light absorption for each wavelength. For example, infrared light with a wavelength of 1,000 nm is absorbed by approximately half at a depth of 70 µm in the semiconductor substrate 2.

Carriers generated at a deep position of the semiconductor substrate 2 diffuse to reach the depletion layer region in the PN junction. In this embodiment, in order to prevent the carriers from reaching an adjacent photodiode due to lateral diffusion, the modified layer 10 is formed between adjacent photodiodes by laser irradiation. The modified layer 10 is formed as follows. Laser light with such a wavelength that transmits through the semiconductor substrate is adjusted so that a focal point thereof may be formed at a predetermined depth in a wafer with use of a condensing lens, and the surface of the wafer is scanned with the laser light so that a planar modified layer configured to trap carriers may be formed in an internal region of the wafer at a given depth. It is desired that the depth of the modified layer be larger than the depth of the photodiode 11.

Carriers generated at a deep position of the semiconductor substrate 2 are trapped by the closest modified layer 10, and are eliminated after recombination. The depth of the modified layer is arbitrarily set depending on the wavelength of the incident light L1. For infrared light with a wavelength of 1,000 nm, for example, the modified layer is formed with a depth of from 10 to 100 µm by reference to FIG. 3 so as to have high absorption efficiency.

In the case of an image sensor in which the semiconductor light receiving elements are one-dimensionally arranged, the modified layers may be one-dimensionally arranged between adjacent photodiodes. In the case of an image sensor in which the semiconductor light receiving elements are two-dimensionally arranged, the modified layers are arranged between adjacent photodiodes so as to surround each photodiode, and hence the modified layers are arranged in a lattice. In this manner, crosstalk between pixels due to lateral diffusion to an adjacent pixel may be suppressed.

Second Embodiment

Figure 4:
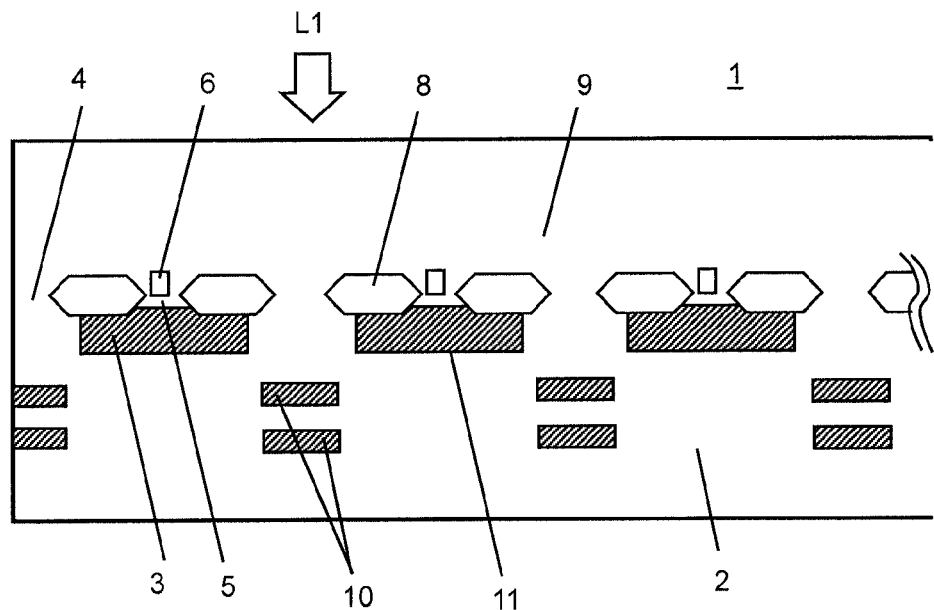
FIG. 4 is a cross-sectional view of a semiconductor light receiving element according to a second embodiment of the present invention taken along the line A-A of FIG. 1.

FIG. 4 is a cross-sectional view of a semiconductor light receiving element of an image sensor according to a second embodiment of the present invention. Parts corresponding to those of FIG. 2 are denoted by the same reference numerals. The difference from the first embodiment illustrated in FIG. 2 resides in that the modified layer 10 is formed as multiple layers in the depth direction. The modified layer 10 is formed as multiple layers in order to prevent lateral diffusion of carriers generated at depths corresponding to different wavelengths of incident light.

Third Embodiment

Figure 5:
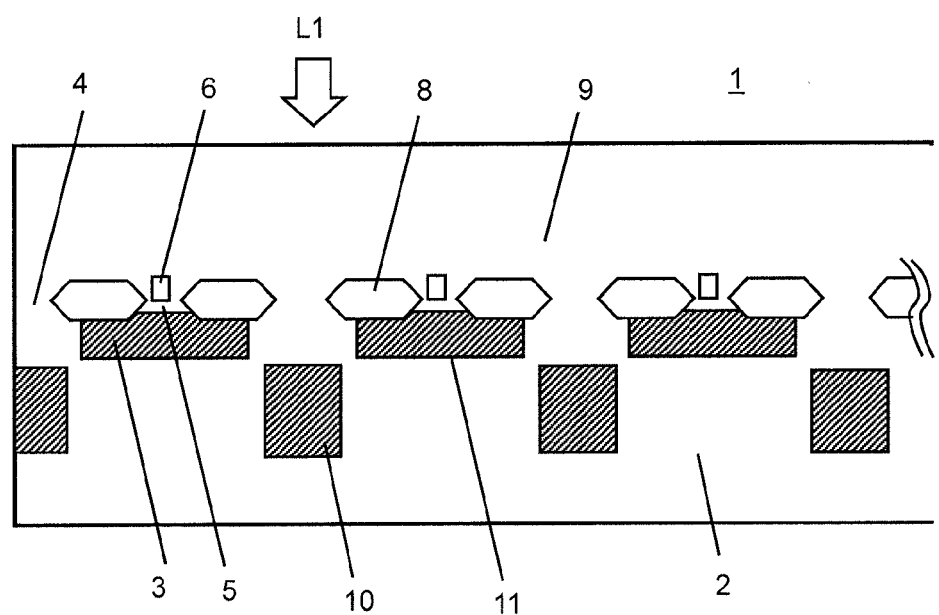
FIG. 5 is a cross-sectional view of a semiconductor light receiving element according to a third embodiment of the present invention taken along the line A-A of FIG. 1.

FIG. 5 is a cross-sectional view of a semiconductor light receiving element of an image sensor according to a third embodiment of the present invention. Parts corresponding to those of FIG. 2 are denoted by the same reference numerals. The difference from the first embodiment illustrated in FIG. 2 resides in that the modified layer 10 is formed thick in the vertical direction. In order to prevent lateral diffusion of carriers generated at depths corresponding to different wavelengths of incident light, the numerical aperture NA of an objective lens for condensing laser light is set to be large so that the modified layer 10 may be formed thick.

What is claimed is:

1. An image sensor, comprising:
    a plurality of semiconductor light receiving elements formed on a semiconductor substrate; and
    a modified layer configured to trap carriers and formed in an internal region of the semiconductor substrate between adjacent ones of the plurality of semiconductor light receiving elements, the modified layer having a configuration depth, the configuration depth being set depending on a depth of the carriers generated in the semiconductor substrate by an incident light,
    wherein the modified layer is formed in the internal region of the semiconductor substrate at a given depth as a planar layer configured to trap carriers, the modified layer being formed by adjusting laser light of a wavelength that transmits through the semiconductor substrate so that a focal point thereof is formed at a predetermined depth in the semiconductor substrate with use of a condensing lens, and scanning a surface of the semiconductor substrate with the laser light.

2. An image sensor according to claim 1, wherein a plurality of the modified layers are formed in a depth direction.

3. An image sensor according to claim 1, wherein the modified layer is formed as multiple layers spaced apart from one another in a depth direction.

4. An image sensor according to claim 1, wherein the modified layer is formed thick.

5. An image sensor, comprising:
    a semiconductor substrate of a first conductivity type;
    a semiconductor region of a second conductivity type joined with the semiconductor substrate to form a plurality of photodiodes; and
    a modified layer formed in a region of the semiconductor substrate between adjacent ones of the plurality of the photodiodes by laser light irradiation, the modified layer being located entirely within an internal region of the semiconductor substrate at a depth below the plurality of photodiodes, the depth of the modified layer being set depending on a depth of carriers generated in the semiconductor substrate by incident light.

6. An image sensor according to claim 5, wherein the modified layer comprises multiple layers spaced apart from one another in a depth direction of the semiconductor substrate.

7. An image sensor according to claim 5, wherein the modified layer has a thickness in a depth direction of the semiconductor substrate that is thick enough to prevent lateral diffusion of carriers generated at depths corresponding to different wavelengths of incident light.

8. An image sensor according to claim 5, wherein the modified layer has a planar shape.

9. An image sensor according to claim 5, wherein the modified layer is formed by irradiating the semiconductor substrate with laser light focused at a depth in the semiconductor substrate that allows the modified layer to effectively trap carriers.

* * * * *